United States Patent [19]

Takamura

[11] Patent Number: 5,210,857
[45] Date of Patent: May 11, 1993

[54] DATA PROCESSING APPARATUS WITH NOISE AVOIDANCE

[75] Inventor: Yoshinobu Takamura, Tokyo, Japan

[73] Assignee: Pioneer Electronic Corporation, Tokyo, Japan

[21] Appl. No.: 700,808

[22] Filed: May 16, 1991

[30] Foreign Application Priority Data

Nov. 28, 1990 [JP] Japan ................................. 2-331492

[51] Int. Cl.$^5$ ............................................. G06F 11/00
[52] U.S. Cl. ..................................... 395/550; 307/517
[58] Field of Search ............... 307/231, 510, 516, 517; 364/DIG. 1, DIG. 2, 514; 395/550, 325

[56] References Cited

U.S. PATENT DOCUMENTS 4,393,453 7/1983 Nakano ................................. 364/514

*Primary Examiner*—Robert L. Richardson
*Attorney, Agent, or Firm*—Wegner, Cantor, Mueller & Player

[57] ABSTRACT

There is disclosed a data processing apparatus in which when a data existence position pulse indicative of the input of a data signal is supplied, a process of the supplied data signal is started in response to the leading edge of the data existence position pulse, a pulse signal of a predetermined width is generated after the elapse of only a first predetermined time from the leading edge of the data existence position pulse, the generation of an output data signal indicative of the result of the process is blocked by a switch for the generating period of the pulse signal, and the output data signal indicative of the result of the process is relayed and transmitted by the switch for only a second predetermined time from the extinguishment of the pulse signal. Thus, only the effective data can be generated.

2 Claims, 3 Drawing Sheets

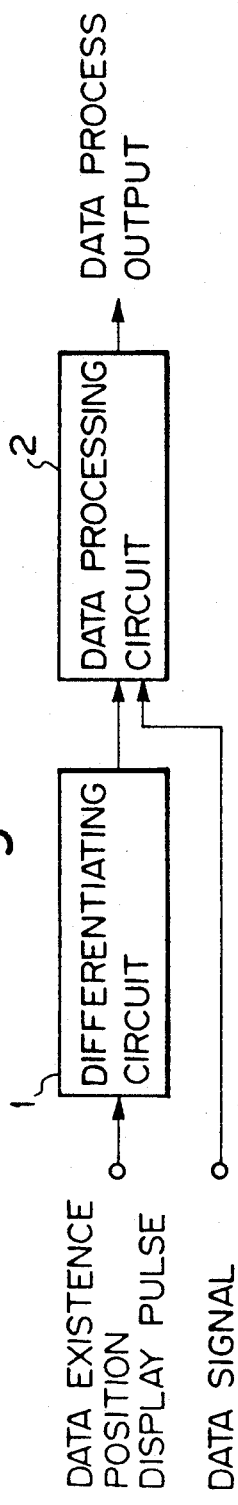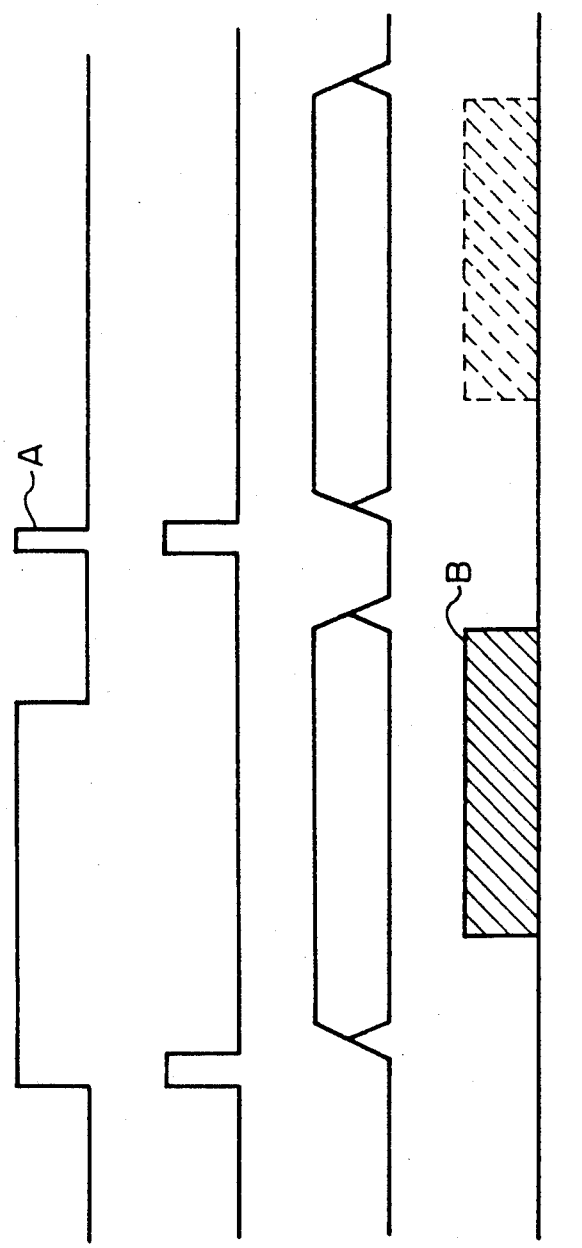

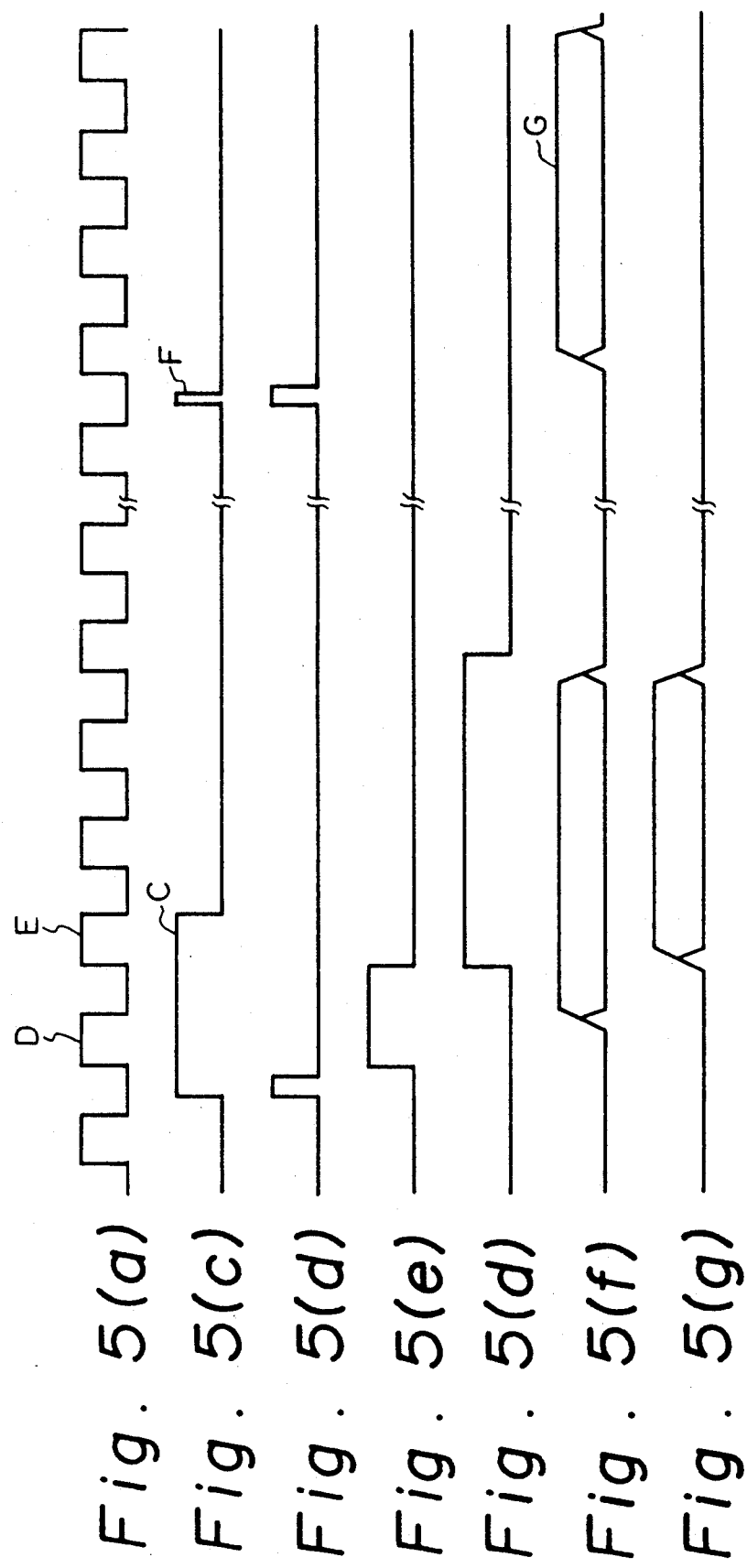

DATA PROCESSING APPARATUS WITH NOISE AVOIDANCE

BACKGROUND OF THE INVENTION

1. Field of the Invention

The present invention relates to a data processing apparatus for processing data each time the data is supplied.

2. Description of the Related Art

There is a data processing apparatus for processing data in accordance with a predetermined program when the data is supplied. As a conventional apparatus of such a data processing apparatus, as shown in FIG. 1, a data existence position display pulse is supplied to a differentiating circuit 1. The data existence position display pulse is a signal which is supplied as another signal different from a data signal and which is supplied so as to form a pair together with the data signal or is a signal locating at the head of the data signal as a part thereof. When the data existence position display pulse is supplied to the differentiating circuit 1 as shown in FIG. 2(a), the differentiating circuit 1 differentiates the data and generates a trigger signal as shown in FIG. 2(b). A data processing circuit 2 is connected to an output terminal of the differentiating circuit 1. For instance, the data processing circuit 2 comprises a microcomputer. When the trigger signal is supplied, the data processing circuit 2 operates in response to a clock pulse and executes an arithmetic operation in accordance with the supplied data and generates data indicative of the result of the arithmetic operation as shown in FIG. 2(c).

However, in the conventional data processing apparatus, the differentiating circuit 1 must have a high response speed suitable to promptly respond to a leading edge of the data existence position display pulse when a pulse is supplied. Thus, there is a problem such that the differentiating circuit operates and generates the trigger signal not only in the case where the data existence position display pulse has been supplied but also in the case where a pulse-like noise signal has been mixed as shown by reference character A in FIG. 2(a), so that the data processing circuit 2 erroneously operates and generates data indicative of the wrong processing result. In addition, there is also a problem such that, since the output data, which is obtained until the operation of the data processing circuit itself according to the clock pulse is stabilized in the data processing circuit in response to the supply of the trigger signal cannot become the effective data, even in the case of the data which has been generated as shown in FIG. 2(c), the data of the portion other than the portion shown by reference character B in FIG. 2(d) is not the effective data.

SUMMARY OF THE INVENTION

It is an object of the invention to provide a data processing apparatus which can prevent a data processing circuit from generating wrong data even in the case that a pulse-like noise signal has been mixed with the data, so that the circuit and which generates only effective data.

According to a data processing apparatus of the invention, a data existence position pulse indicative of the input of a data signal is supplied, a trigger signal is generated in response to a leading edge of the supplied pulse, a process of the data signal which is supplied is started in response to the trigger signal and output data signal indicative of the result of the process includes generated, wherein the apparatus is pulse generating means for generating a pulse signal of a predetermined width when the supplied pulse exists after the elapse of only a first predetermined time from the leading edge of the supplied pulse and switching means for blocking the generation of the output data signal in the generation period of time of the pulse signal and for relaying and transmitting the output data signal for only a second predetermined time from the extinguishment of the pulse signal.

According to the data processing apparatus of the invention, when the data existence position pulse indicative of the input of the data signal is supplied, the trigger signal is generated in response to the leading edge of the data existence position pulse, and the process of the data signal supplied is started in response to the trigger signal. The pulse signal of a predetermined width is generated after the elapse of only the first predetermined time from the leading edge of the data existence position pulse. The generation of the output data signal indicative of the result of the process is blocked by the switching means for the generation period of time of the pulse signal and the output data signal indicative of the result of the process is relayed and transmitted by the switching means for only the second predetermined time from the extinguishment of the pulse signal. If a pulse-like noise signal has been mixed with the data signal, the pulse signal of the predetermined width is not generated and the switching means is held in the off state. Therefore, even if the output data indicative of the erroneous processing result has been supplied to the switching means, the output data is shut out and the generation of the output data is blocked.

BRIEF DESCRIPTION OF THE DRAWINGS

FIG. 1 is a block diagram showing a conventional data processing apparatus;

FIGS. 2(a) to 2(d) are waveform diagrams showing the operation of each section of the apparatus of FIG. 1;

FIGS. 5(a) to 5(g) are waveform diagrams showing the operation of each section of the apparatus of FIG. 3.

DETAILED DESCRIPTION OF PREFERRED EMBODIMENTS

Figure 3:
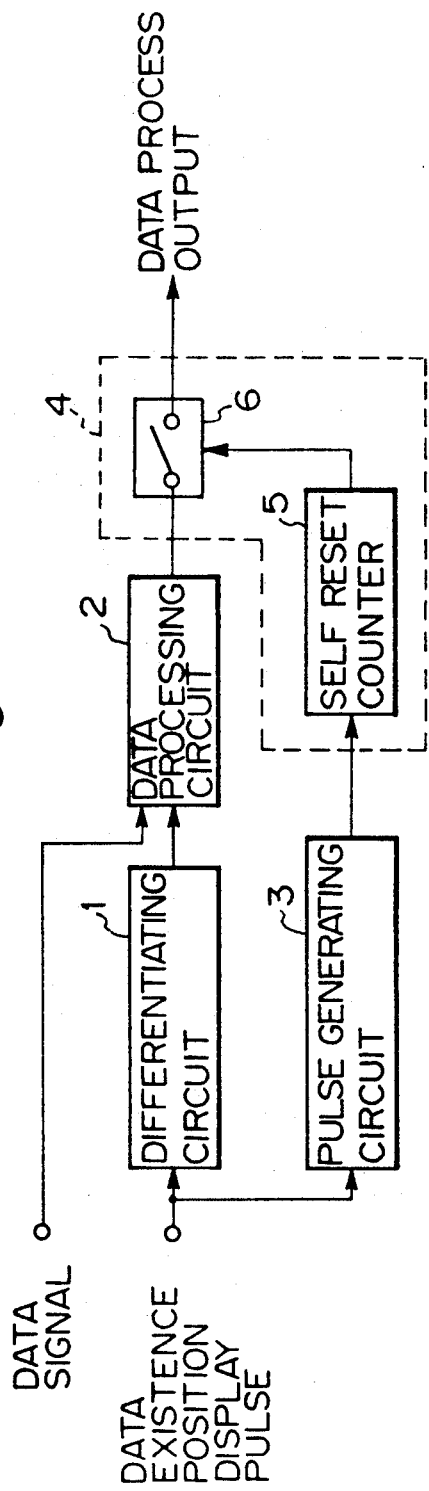
FIG. 3 is a block diagram showing an embodiment of the invention.

In a data processing apparatus according to the invention shown in FIG. 3, the same portions as those in FIG. 1 are designated by the same reference numerals. The data existence position pulse is supplied to both the differentiating circuit 1 and a pulse generating circuit 3. The pulse generating circuit 3 generates a pulse signal of a predetermined width in accordance with the existence of a pulse after the elapse of only a first predetermined time after the pulse had been supplied to the differentiating circuit 1. On the other hand, a switching circuit 4 is connected to an output terminal of the data processing circuit 2. The switching circuit 4 relays and transmits the output data of the data processing circuit 2 when the pulse signal has been supplied as an on-pulse signal from the pulse generating circuit 3. Practically speaking, the switching circuit 4 comprises a self reset counter 5 and a switch 6. The self reset counter 5 generates the on-pulse signal in response to a trailing edge of the pulse signal from the pulse generating circuit 3 and also starts to count clock pulses which are generated from a clock generator (not shown). When a count value has reached a predetermined value, the counter 5 stops the generation of the on-pulse signal. The other construction is similar to that of the conventional apparatus shown in FIG. 1.

Figure 4:
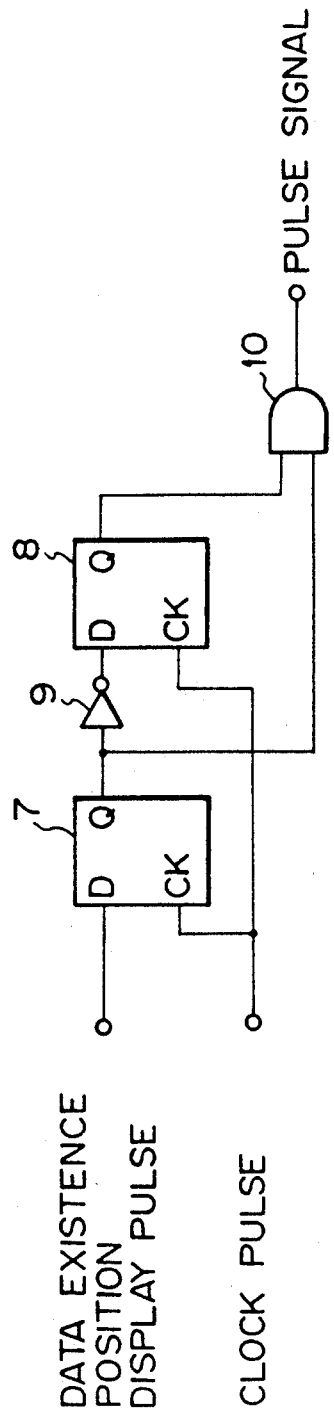
FIG. 4 is a block diagram showing a practical construction of a pulse generating circuit in the apparatus of FIG. 3.

For instance, the pulse generating circuit 3 can be constructed by D flip-flops 7 and 8, an invertor 9, and an AND circuit 10 as shown in FIG. 4. That is, the data existence position pulse is supplied to an input terminal Q of a flip-flop 7. An output terminal Q of the flip-flop 7 is connected to an input terminal Q of a flip-flop 8 through an invertor 9 and is directly connected to one input terminal of an AND circuit 10. An output terminal Q of the flip-flop 8 is connected to the other input terminal of the AND circuit 10. Clock pulses are supplied to clock terminals CK of the flip-flops 7 and 8. A pulse signal of a predetermined width is generated from an output terminal of the AND circuit 10.

In the data processing apparatus according to the invention, in the case where a data signal is supplied, a trigger signal is generated from the differentiating circuit 1 as shown in FIG. 5(c) in response to a leading edge of the data existence position pulse (C in FIG. 5(b)) indicative of the supply of the data signal. When the trigger signal is supplied, the data processing circuit 2 operates in response to a clock pulse (FIG. 5(a)) and executes an arithmetic operating process in accordance with the supplied data and generates data indicative of the result of the arithmetic operation as shown in FIG. 5(f). The above operations are similar to those in the conventional apparatus.

When the data existence position pulse is supplied to the pulse generating circuit 3, the signal level of the output terminal Q of the flip-flop 7 is inverted to the high level in response to the leading edge of the clock pulse (D in FIG. 5(a)) after the time point of the supply of the pulse. At this time, since the output terminal Q of the flip-flop 8 is at the high level, the output level of the AND circuit 10 is set to the high level. The output terminal Q of the flip-flop 8 is inverted into the low level in response to the leading edge of the next clock pulse (E in FIG. 5(a)). At this time, if the data existence position pulse exists, the output terminal Q of the flip-flop 7 is held at the high level and the output level of the AND circuit 10 is set to the low level. Therefore, a pulse signal of a time width corresponding to one period of the clock pulse is generated from the pulse generating circuit 3 as shown in FIG. 5(d).

In response to the trailing edge of the pulse signal from the pulse generating circuit 3, the self reset counter 5 is set to the high output level as shown in FIG. 5(e) and counts the clock pulses. When the count value of the clock pulses has reached a predetermined value, the output level of the counter 5 is set to the low level. The high level output signal of the counter 5 is supplied as an on-pulse signal to the switch 6. The switch 6 is turned on for the supplying period of time of the on-pulse signal. The output data indicative of the result of the process of the data processing circuit 2 is generated as shown in FIG. 5(g) through the switch 6. The data which is transmitted from the switch 6 is constructed by only the effective data.

On the other hand, in the case where a pulse-like noise signal F in FIG. 5(b) has been supplied to the differentiating circuit 1 and the pulse generating circuit, instead of the data existence position pulse when no data signal is supplied, the trigger signal is generated from the differentiating circuit 1. However, even if the pulse-like noise signal has been supplied to the pulse generating circuit 3, the output terminal Q of the flip-flop 7 is not inverted to the high level so long as the pulse-like noise signal does not exist when the clock pulse rises after the time point of the supply of such a noise signal. That is, since the pulse-like noise signal has an extremely short time width, there is hardly any possibility that such a noise signal will exist at the leading time point of the clock pulse, so that the pulse signal is ordinarily not generated from the pulse generating circuit 3. Therefore, since the self reset counter 5 is held at the low output level, the switch 6 is maintained to the off state. Even if the output data (G in FIG. 5(f)) indicative of the result of the erroneous process of the data processing circuit 2 has been supplied to the switch 6, the output data is shut out by the switch 6 and the generation of the output data is blocked.

In the above embodiment, although the pulse generating circuit 3 has been constructed as shown in FIG. 4, the invention is not limited to such a construction. For instance, it is also possible to construct the pulse generating circuit 3 in such a manner that by using a delay circuit, an AND circuit, and a monostable multivibrator, the OR of the pulse which is obtained by delaying the input pulse by only a first predetermined time by the delay circuit and the input pulse is calculated by the AND circuit and a pulse signal of a predetermined time width is generated from the monostable multivibrator in accordance with an output signal of the AND circuit.

As described above, in the data processing apparatus of the invention, when the data existence position pulse indicative of the input of the data signal is supplied, the trigger signal is generated in response to the leading edge of the data existence position pulse and the process of the supplied data signal is started in response to the trigger signal. A pulse signal of a predetermined width is generated after the elapse of a first predetermined time from the leading edge of the data existence position pulse. The generation of the output data signal indicative of the result of the process is blocked by the switching means for the generating period of time of the pulse signal. The output data signal indicative of the result of the process is relayed and transmitted by the switching means for only a second predetermined time from the extinguishment of the pulse signal. Therefore, only the effective data can be generated.

On the other hand, when the pulse-like noise signal has been mixed, the pulse signal of a predetermined width is not generated and the switching means maintains the off state. Therefore, even if the output data indicative of the result of the erroneous process has been supplied to the switching means, the output data is shut out by the switching means and generation of the output data is blocked.

What is claimed is:

1. A data processing apparatus to which a data existence position pulse indicative of an input of a data signal is supplied and which generates a trigger signal in response to a leading edge of the supplied data existence position pulse, starts processing of the supplied data signal in response to said trigger signal and generates an output data signal indicative of a result of the processing, comprising:

pulse generating means for generating a pulse signal of a predetermined width when said supplied data existence position pulse exists after the elapse of only a first predetermined time from the leading edge of said supplied data existence position pulse, and switching means for blocking the generation of said output data signal during a generating period equal to said pulse signal, and relaying and transmitting said output data signal for only a second predetermined time from an extinguishment of said pulse signal.

2. An apparatus according to claim 1, wherein said pulse generating means generates said pulse signal synchronously with a clock pulse.

* * * * *